United States Patent [19]
Robinson et al.

[11] Patent Number: 5,981,396
[45] Date of Patent: Nov. 9, 1999

[54] METHOD FOR CHEMICAL-MECHANICAL PLANARIZATION OF STOP-ON-FEATURE SEMICONDUCTOR WAFERS

[75] Inventors: Karl M. Robinson; Michael A. Walker, both of Boise, Id.

[73] Assignee: Micron Technology, Inc., Boise, Id.

[21] Appl. No.: 09/287,953

[22] Filed: Apr. 7, 1999

Related U.S. Application Data

[63] Continuation of application No. 08/651,896, May 21, 1996, Pat. No. 5,893,754.

[51] Int. Cl.[6] .................................................. H01L 21/00
[52] U.S. Cl. .......................... 438/692; 438/693; 216/38; 216/88; 216/89
[58] Field of Search ................................... 438/692, 693; 216/38, 88, 89; 159/345 LP

[56] References Cited

U.S. PATENT DOCUMENTS

| | | | |
|---|---|---|---|
| 4,910,155 | 3/1990 | Cote et al. | 438/693 X |
| 5,232,875 | 8/1993 | Tuttle et al. | 438/693 |
| 5,300,155 | 4/1994 | Sandhu et al. | 438/693 X |

*Primary Examiner*—William Powell
*Attorney, Agent, or Firm*—Seed and Berry LLP

[57] ABSTRACT

The present invention is a method for chemical-mechanical planarization of semiconductor wafers that is highly useful for planarizing stop-on-feature design wafers. Initially, the wafer is positioned against a liquid solution over a planarizing surface of a polishing pad. At least one of the wafer or the pad is moved with respect to the other at a relatively low velocity to maintain a substantially continuous film of liquid solution between the wafer and the pad. The temperature of a pad platen is also controlled to maintain a relatively low temperature of the liquid solution at which the solution is highly selective to a layer of material on the wafer.

12 Claims, 5 Drawing Sheets

METHOD FOR CHEMICAL-MECHANICAL PLANARIZATION OF STOP-ON-FEATURE SEMICONDUCTOR WAFERS

CROSS-REFERENCE TO RELATED APPLICATION

This application is a continuation of U.S. patent application Ser. No. 08/651,896, filed May 21, 1996, U.S. Pat. No. 5,893,754.

DESCRIPTION

1. Technical Field

The present application relates to a method for chemical-mechanical planarization of semiconductor wafers, and more particularly, to a chemical-mechanical planarization method that produces a uniform surface across the face of a Stop-On-Feature (SOF) wafer.

2. Background of the Invention

Chemical-mechanical planarization ("CMP") processes are frequently used to planarize the surface layer of a wafer in the production of ultra-high density integrated circuits. In many current CMP processes, a wafer is exposed to a CMP medium under controlled chemical, pressure, velocity, and temperature conditions. Conventional CMP mediums include polishing pads and slurries, and more specifically, a slurry solution containing small, abrasive particles and reactive chemicals covers a planarizing surface on a polishing pad. The wafer and/or the polishing pad are then moved relative to one another allowing the CMP mediums to remove the surface of the wafer.

CMP processes must consistently and accurately planarize a uniform, planar surface on the wafer at a desired end-point. Several hundred microelectronic devices are typically fabricated on a single wafer by depositing layers of various materials on the wafer, and manipulating the wafer and the other layers of material with photolithographic, etching, and doping processes. In order to manufacture ultra-high density integrated circuits, CMP processes must provide a highly planar surface upon which the geometries of the component parts of the die may be accurately positioned across the full surface of the wafer. Current lithographic techniques, for example, must accurately focus the circuit patterns to within a tolerance of approximately 0.1–0.5 $\mu$m. If the surface of the wafer is not highly planar, the circuit pattern may not be sufficiently focused in some areas, resulting in defective devices. Therefore, it is important to consistently and accurately planarize a uniformly planar surface on the wafer.

Current CMP processes, however, do not consistently produce a sufficiently uniform, planar surface all the way across the wafer. The rate at which material is removed from the surface of the wafer (the "polishing rate") affects the uniformity of the resulting surface because it may vary from one area on the wafer to another. The polishing rate may vary across the face of the wafer for several reasons, some of which are as follows: (1) the difference in relative velocity between the surface of the wafer and the polishing pad from the center of the wafer to its edge; (2) the difference in slurry distribution and flow rates across the surface of the wafer; (3) any variance in the composition of the material across the wafer; (4) the degree of non-uniformity of the typography of the wafer; (5) the face of the wafer and the surface of the polishing pad may not be parallel with each other throughout the CMP process; (6) the slurry temperature varies across the face of the wafer; and (7) the condition of the polishing pad changes reducing the polishing pad uniformity. Accordingly, since the polishing rate of a wafer may vary from one region of the wafer to another, current CMP processes do not consistently produce a sufficiently planar surface on the resulting wafer.

One relatively new aspect of CMP processing for improving the uniformity and planarity of the surface of wafers is the stop-on-feature wafer design. In a typical SOF wafer, a first layer of material is deposited over the wafer substrate and the features that are fabricated on the substrate, and a second layer of material is deposited over the first layer. The first layer is made from a material that has a relatively low polishing rate, while the second layer is made from a material that has a relatively high polishing rate. In operation, the second layer is planarized until the first layer is exposed. Since the first layer has a lower polishing rate than that of the second layer, any high regions of the second layer will be removed faster than the exposed portions of the first layer. The SOF design, therefore, enhances the uniformity and planarity of the wafer surface because it allows the CMP process to remove the high points along the wafer faster than the low points.

One problem with planarizing an SOF wafer with current CMP oxide processes is that the resulting surface on the wafer is still not sufficiently uniformly planar for some microelectronic devices. Conventional CMP processes, for example, generally produce a finished surface on an SOF wafer with step heights of 2000 Å–3000 Å at the interfaces between the materials of the first and second layers. The planarized surface of an SOF wafer may not be sufficiently uniform because current CMP processes rely primarily on the mechanical abrasiveness of the polishing pad and the particles in the slurry to remove material from the wafer; some regions of the first layer will accordingly be exposed before other regions when the surface of the wafer and the surface of the polishing pad are not parallel to each other, or the slurry is not distributed evenly under the wafer.

Another problem with planarizing SOF wafers with conventional CMP processes is that polishing pad uniformity decreases such that the removal rate varies significantly from one area on the pad to another. Since the first layer is hard, initially exposed two-component areas on the wafer abrade localized areas on the pad causing the pad to have high removal rates in localized areas. Conversely, the soft second layer on the wafer glazes the pad in other areas causing the pad to have low removal rates over the glazed areas. Thus, conventional SOF wafer planarization causes a large divergence in polishing pad uniformity that reduces the planarity of the finished wafers.

Conventional CMP processes attempt to reduce the step heights on SOF wafers by using selective slurries that chemically remove the second layer of material at a faster rate than the first layer of material. In order to increase throughput, conventional CMP processes also use high relative velocities between the pad and wafer, and high temperatures at the pad-wafer interface. The selectivity of the slurry, however, is reduced at higher temperatures because heat causes chemicals in the slurry to react more aggressively with the material of the first layer. Thus, even when the slurry is selective to the second layer, the finished surface will have low points at the initially exposed regions of the first layer. Additionally, because portions of the first layer are now exposed, nonuniformities are introduced to the polishing pad during the polishing cycle that result in uneven polishing of non-exposed areas.

Accordingly, it would be desirable to develop a CMP process that (1) reduces the amount of material removed from the initially exposed regions of the first layer; (2) still allows material to be rapidly planarized from the second dielectric layer; and (3) minimizes the effect that the exposed parts of the first layer have on the polishing pad and the simultaneous polishing of the second layer.

SUMMARY OF THE INVENTION

In the inventive method for chemical-mechanical planarization of semiconductor wafers, the wafer is positioned against a layer of liquid solution over a planarizing surface of a polishing pad. At least one of the pad or the wafer is moved with respect to the other at a controlled, relatively low velocity to provide a substantially continuous film of liquid solution between the wafer and the polishing pad. The temperature of a pad platen is controlled to maintain a desired temperature of the liquid solution and to stiffen the pad.

In one embodiment of the inventive method, the wafer is positioned over a high-slurry-transport pad with a planarizing surface and a plurality of wells formed in the planarizing surface for holding a slurry solution. Each well has a hole at the planarizing surface that defines an open area on the planarizing surface. The holes are preferably spaced apart from one another to provide a substantially constant ratio between the open area of the holes and the surface area of the planarizing surface across the pad. The wells are filled with a selective slurry solution, and the wafer and the pad are moved with respect to each other in the presence of the selective slurry to draw the slurry out of the wells and selectively planarize the layers on the surface of the wafer.

DETAILED DESCRIPTION OF THE INVENTION

The present invention is a method for CMP processing that enhances the uniformity of a planarized surface on an SOF wafer even after the polishing stop layer is exposed. In one embodiment of the invention, the method is well suited to substantially prevent material from being planarized from the initially exposed regions of the first layer of an SOF design, while still allowing material to be planarized from the second, outer layer of material. An important aspect of the present invention is to move the wafer and the polishing pad at relatively low velocities to maintain a substantially continuous film of a liquid solution between the wafer and the pad and to reduce the temperature at the pad-wafer interface. Another important aspect of the invention is to control the platen temperature to maintain the temperature of the liquid solution in a range at which the solution is highly selective to the second outer layer of an SOF wafer. The substantially continuous liquid film between the wafer and the pad provides a more uniform distribution of solution across the wafer, and it reduces the temperature at the pad-wafer interface to allow the chemicals in the solution to more selectively remove material from the wafer. Additionally, lower platen temperatures reduce the temperature at the pad-wafer interface to further enhance the selective removal properties of the liquid solution and to stiffen the pad.

Figure 1:
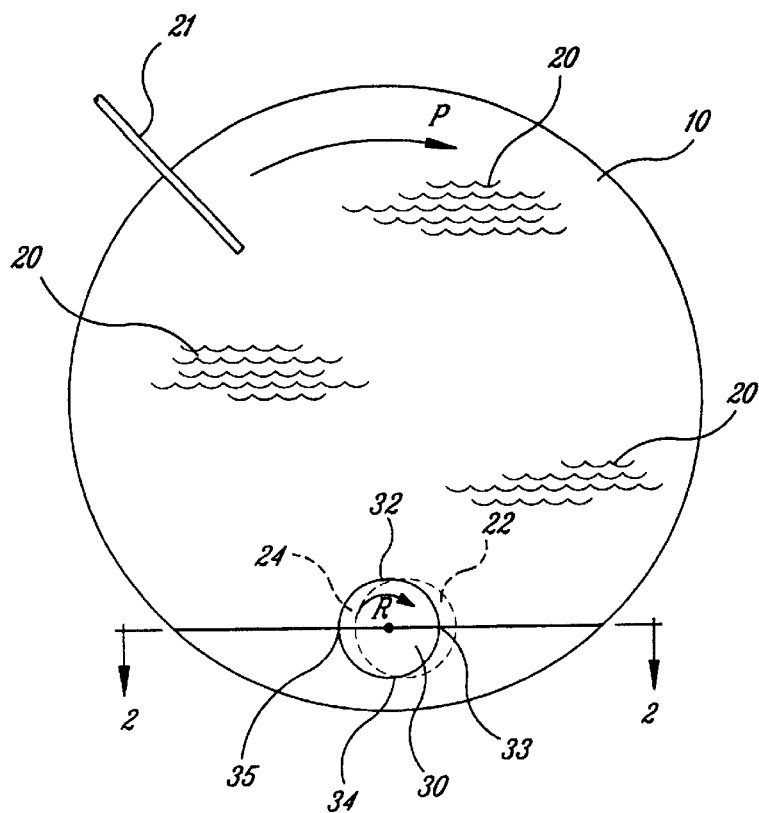
FIG. 1 is a schematic top elevational view of a wafer on a conventional polishing pad in accordance with the prior art.

FIG. 1 illustrates a top view of a wafer 30 being planarized by a conventional polishing process in accordance with the prior art. A polishing pad 10 is generally rotated at approximately 40 rpm in the direction indicated by arrow P, and the wafer 30 is rotated at approximately 10–30 rpm in the direction indicated by arrow R. The wafer 30 also translates across the polishing pad 10 while the wafer 30 rotates. A slurry 20 is discharged onto the top of the polishing pad 10 through a pipe 21. The wafer 30 scrapes the slurry 20 off of the polishing pad 10, and thus the slurry 20 tends to build up in a high zone 22 that extends approximately from an inside point 32 to an outside point 34 along a leading edge 33 around the perimeter of the wafer 30. As the polishing pad 10 progresses underneath the wafer 30 towards the tiling edge 35, the excess of slurry in the high zone 22 depletes the slurry from the center of the wafer to the trailing edge 35. The wafer 30 accordingly experiences a non-uniform, center-to-edge slurry distribution that reduces the uniformity of the surface of the wafer.

Figure 2:
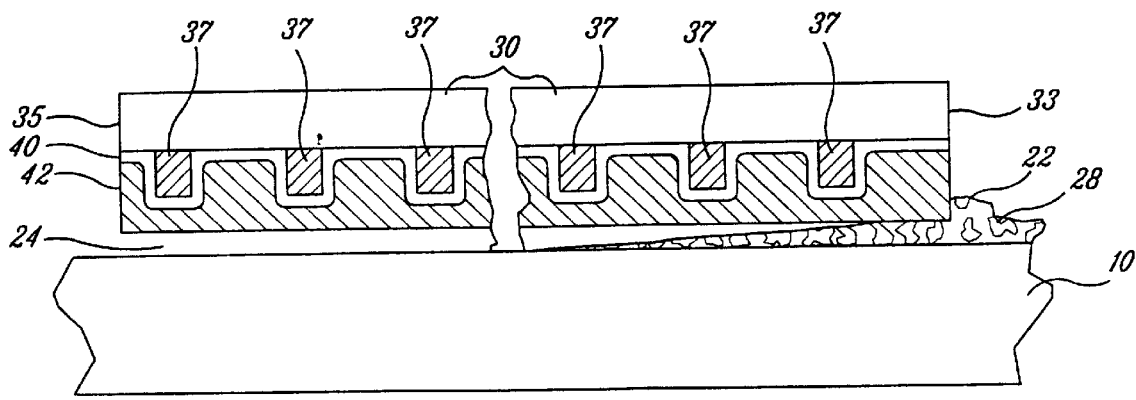
FIG. 2 is a schematic cross-sectional view of the wafer and polishing pad of FIG. 1.

FIG. 2 schematically illustrates a cross-section of an SOF wafer 30 being planarized with a conventional CMP method. The wafer 30 has a number of features 37 fabricated onto its surface. A first dielectric layer 40 is deposited over the features 37 and the wafer 30, and a second dielectric layer 42 is deposited over the first dielectric layer 40. The first dielectric layer 40 has a lower polishing rate than that of the second dielectric layer 42 to enhance the planarity of the resulting dielectric layer, as discussed above in the Background of the Invention section. The wafer 30 is positioned opposite the polishing pad 10 such that the surface of the second dielectric layer 42 is placed against the slurry 20. As best illustrated in FIG. 2, the high zone 22 of the slurry 20 builds up along the area adjacent to the leading edge 33, but the low zone 24 is substantially void of any slurry 20 from approximately the center of the wafer to the trailing edge 35. Accordingly, both the mechanical and chemical removal of the resulting surface is generally non-uniform because the slurry is not distributed evenly across the whole surface of the wafer.

Figure 3:
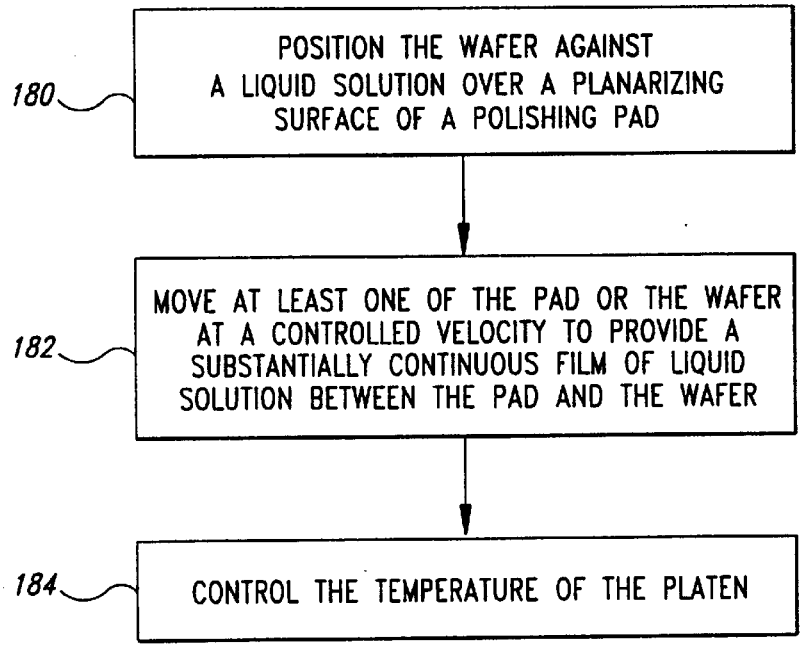
FIG. 3 is a flow chart of a method for chemical-mechanical planarization of a stop-on-feature semiconductor wafer in accordance with the invention.

FIG. 3 illustrates the steps in an embodiment of a method for chemical-mechanical planarization of an SOF semiconductor wafer. In the first step 180 of the method, a wafer is positioned against a liquid solution over a planarizing surface of a polishing pad. The liquid solution may be a conventional CMP slurry that mechanically removes material from the wafer with abrasive particles and chemically removes materials with etching and/or oxidizing chemicals. In a preferred embodiment, the abrasive particles are made from a material selective to silicon oxide, such as $CeO_2$. The liquid solution may also be a non-abrasive solution without abrasive particles, such as a solution containing ammonium hydroxide as an active agent to selectively remove silicon oxide from an underlayer of silicon nitride. In the case of non-abrasive liquid solutions, the polishing pad preferably is impregnated with abrasive particles to provide an abrasive polishing surface on the pad.

In a subsequent step 182 of the method, the pad and wafer are moved with respect to each other at relatively low velocities to provide a substantially continuous film of liquid solution between the wafer and the pad. In general, a 20–24 inch diameter pad is rotated at approximately 25–35 rpm, and preferably at approximately 30 rpm. The wafer is preferably rotated at approximately 10–30 rpm, and preferably at approximately 15 rpm. The relative velocity between the pad and the wafer is controlled to hydroplane the wafer on the liquid solution and provide a substantially continuous film of liquid solution between the wafer and the pad. In a specific embodiment, a Rodel IC-1000 perforated pad with standard perforations, manufactured by Rodel Corporation of Newark, Del., is covered with a Rodel ILD-1300 slurry (also manufactured by Rodel Corporation). To provide a substantially continuous film of liquid solution between the pad and wafer in this embodiment, the pad preferably is rotated at 25–35 rpm, the wafer preferably is rotated at 10–30 rpm, and the down force against the wafer preferably is 5 psi.

The relative velocity between the wafer and the pad is generally low compared to conventional CMP techniques to enhance the selective removal of material from the wafer. Low relative velocities reduce the non-selective mechanical removal of wafer material because fewer abrasive particles abrade the surface of the wafer., Low relative velocities also enhance the chemically selective removal of material because a more uniform film of the liquid solution covers the surface of the wafer and the temperature at the pad-wafer interface is reduced.

In another subsequent step 184 of the method, the temperature of the pad is controlled to further enhance the selective removal of material from the wafer. The pad temperature is controlled by maintaining the platen at a temperature of approximately 85° F.–105° F., and preferably approximately 89° F.–91° F. Compared to conventional CMP processes that heat the platen to approximately 115° F., the platen temperature is significantly lower in the method of the invention. The lower platen temperature reduces the rate at which the chemicals in the slurry react with the material on the wafer to further enhance the selective removal of one layer of material.

Figure 4:
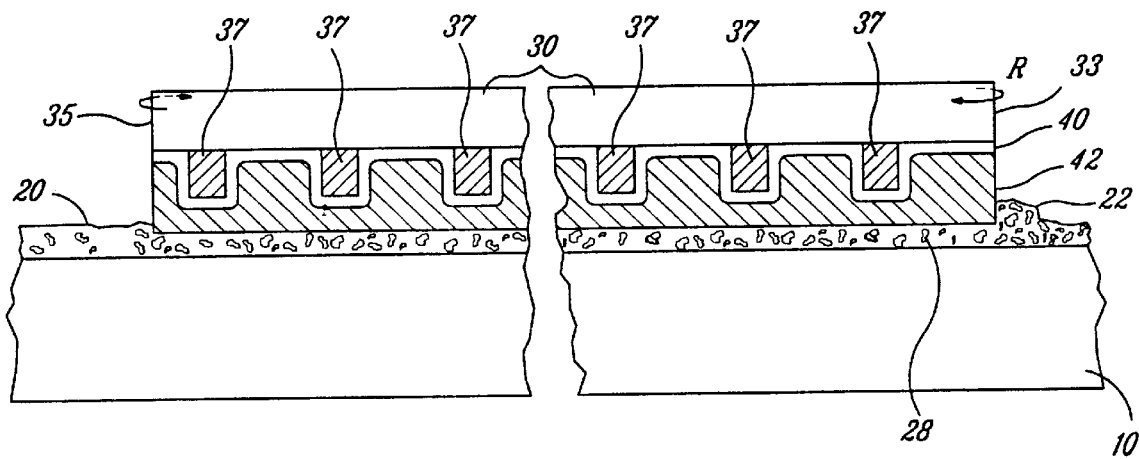
FIG. 4 is a cross-sectional view of a wafer being planarized in accordance with a method of the invention.

Referring to FIG. 4, an SOF wafer 30 is shown being planarized in accordance with the method discussed above with respect to FIG. 3. The pad rotates at approximately 25–35 rpm, and the platen 12 is heated to approximately 85° F.–105° F. The slurry 20 is selective to the second dielectric layer 42 on the wafer 30 to remove material from the second dielectric layer 42 without significantly removing material from the first dielectric layer 40. Thus, even when portions of the first layer 40 are exposed before the second layer 42 is completely planarized, a minimal amount of material is removed from the exposed portions of the first layer 40 as the wafer 30 is further planarized.

The method illustrated in FIGS. 3 and 4 produces a more uniform surface on SOF wafers because it reduces the mechanical abrasion of the wafer and enhances the selective removal of the second dielectric layer 42. The invention reduces mechanical removal of material by moving the pad and wafer with respect to each other at a relative velocity that provides a thin, substantially continuous film of liquid solution between the pad and the wafer. The invention accordingly enhances the selective removal of the second dielectric layer 42 because the slower pad speed, lower pad-wafer interface temperature, and reduced abrasion allow the slurry chemicals to aggressively remove the second dielectric layer 42 without removing significant amounts of the first dielectric layer 40. As a result, the method illustrated in FIG. 3 produces a wafer with step heights between 200 Å–300 Å.

The method illustrated in FIGS. 3 and 4 also produces a more uniformly planar surface on the wafer because the polishing pad surface deteriorates substantially uniformly. The substantially continuous film of liquid solution between the pad and the wafer reduces the contact between the pad and wafer. As a result, the initially exposed two-component areas on the wafer are substantially prevented from abrading localized areas on the pad. The spatial differentiations of the polishing rate across the pad, therefore, are substantially reduced by the present invention.

Figure 5A:
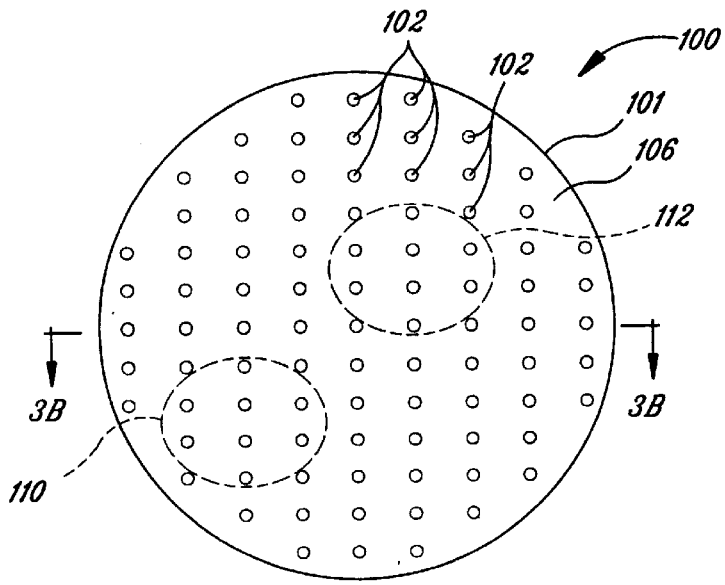
FIG. 5A is a top elevational view of a polishing pad used in accordance with the method of the invention.
Figure 5B:
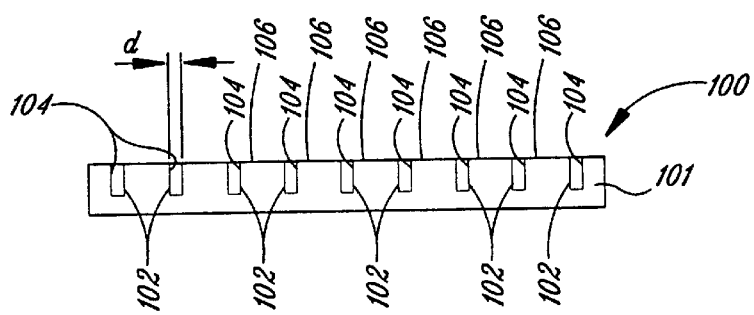
FIG. 5B is a cross-sectional view of the polishing pad of FIG. 5A.

The method of the invention is preferably practiced with a polishing pad that enhances the transportation of liquid solution across the face of the wafer. The liquid solution preferably is a CMP slurry, and the reference to slurry will hereinafter encompass liquid solutions with or without abrasive particles. FIGS. 5A and 5B illustrate a suitable high-slurry-transport polishing pad 100 that has a body 101 and a number of wells 102 formed into the body 101. The upper surface of the body 101 defines a planarizing surface 106, and each of the wells has a hole 104 at the planarizing surface 106. The holes 104 each have an open area that, in the case of a circular hole, is determined by the diameter "d" of each of the holes 104. The holes 104 are spaced apart from one another in a uniform pattern such that the ratio of the open area of the holes 104 to the surface area of the planarizing surface 106 is substantially constant across the entire pad 100. For example, the ratio of the open area of the holes 104 to the surface area 106 in a region 110 is substantially equal to that of another region 112.

Figure 6:
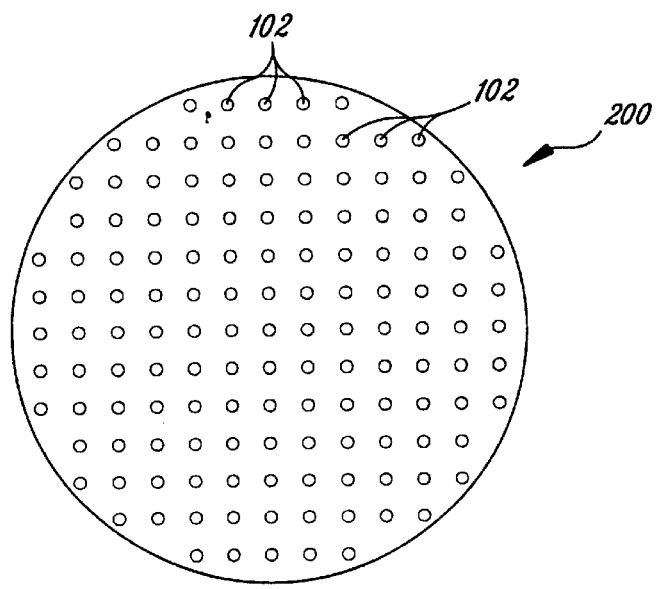
FIG. 6 is a top elevational view of another polishing pad used in accordance with the method of the invention.
Figure 7:
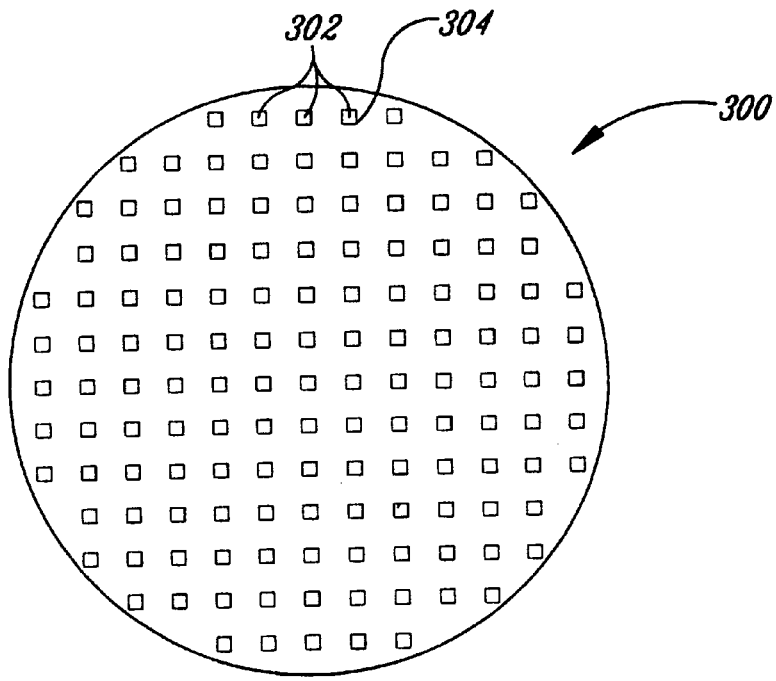
FIG. 7 is a top elevational view of another polishing pad used in accordance with the method of the invention.
Figure 8:
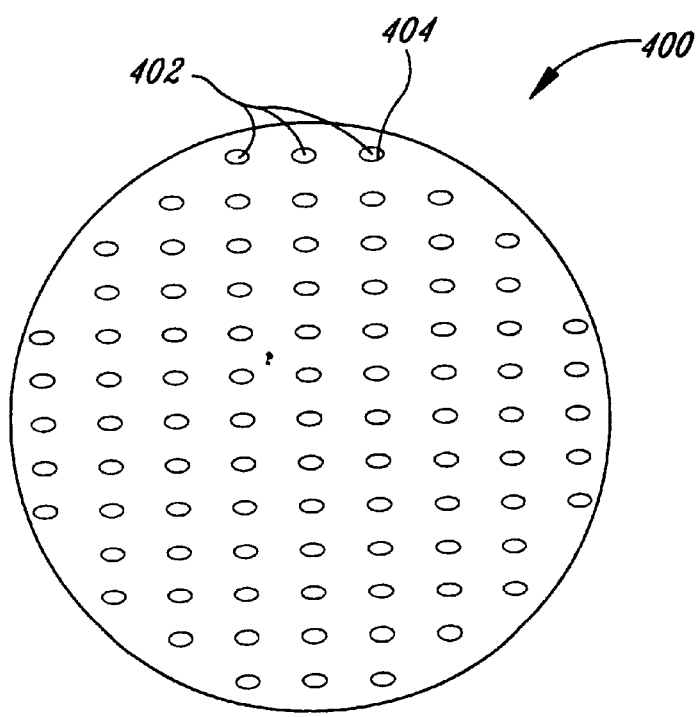
FIG. 8 is a top elevational view of another polishing pad used in accordance with the method of the invention.

FIGS. 6–8 illustrate alternative embodiments of high-slurry-transport polishing pads. FIG. 6 illustrates a polishing pad 200 with wells 102 that are formed in a uniform pattern in which the wells 102 are spaced an equal distance from one another across the surface area of the pad 200. FIG. 7 illustrates another polishing pad 300 with wells 302 that have rectangular holes 304, and FIG. 8 illustrates another pad 400 with wells 402 that have elliptical holes 404. In a preferred embodiment, a pad with circular holes, such as the holes 104 of pads 100 and 200 shown in FIGS. 5A and 5B, is used in the method of the invention.

Figure 9A:
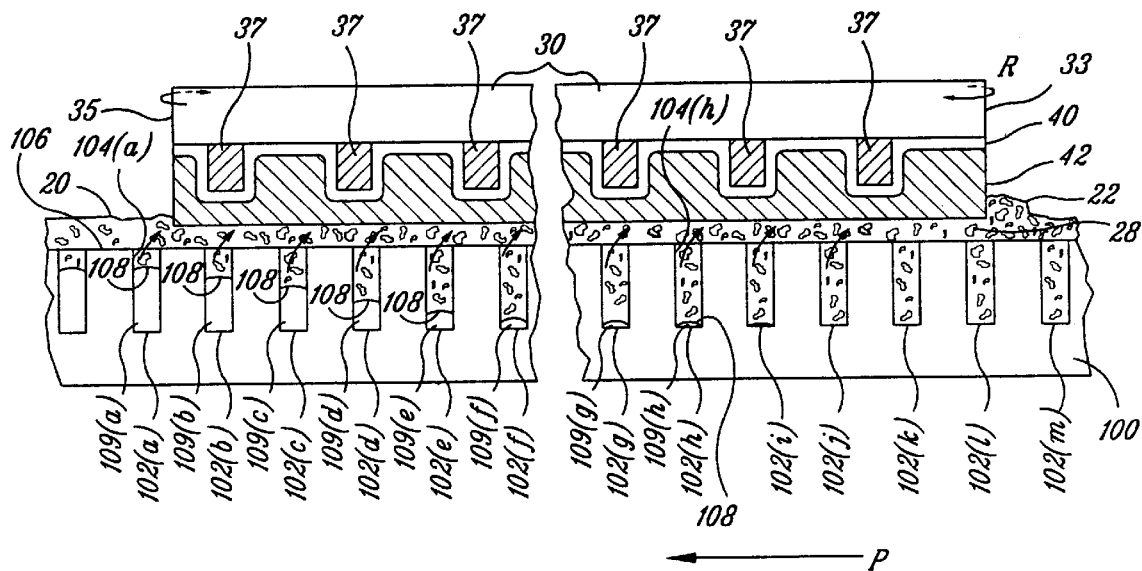
FIG. 9A is a schematic cross-sectional view of a polishing pad used in accordance with the method of the invention in operation at one point in time.
Figure 9B:
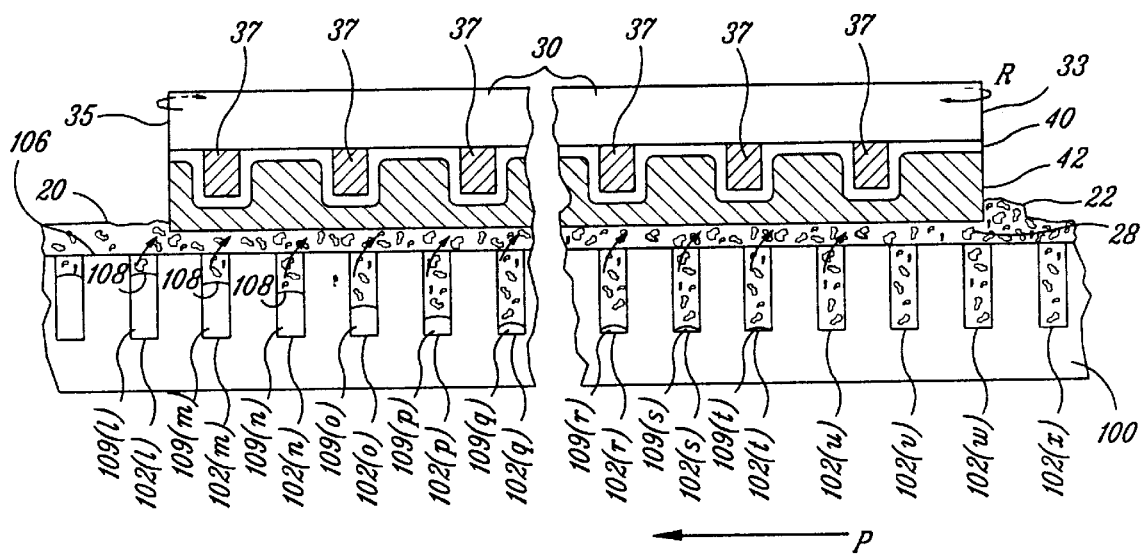
FIG. 9B is a schematic cross-sectional view of the polishing pad of FIG. 9A in operation at a subsequent point in time.

The operation and advantages of the method of the invention and a high-slurry-transport pad are best illustrated in FIGS. 9A and 9B. FIG. 9A schematically shows an SOF wafer 30 being polished by a pad 100 at a first point in time. The pad 100 rotates at a rate between 25 and 35 rpm in a direction P, and the wafer 30 rotates at a rate between 10 and 30 rpm in a direction R, to cause the wafer 30 to ride on a substantially continuous film of slurry. The pad 100 generally has a much larger radius than the wafer 30, and thus the pad 100 has a much higher linear velocity than that of the wafer 30.

In operation, the slurry 20 fills the wells 102 before the wells 102 pass under the wafer 30, as shown by wells 102(*j*)

through 102(*m*). The difference in velocity between the pad 100 and the wafer 30 creates a low pressure region along the planarizing surface 106 of the pad that draws the slurry 20 out of the wells 102. Wells 102(*j*) and 102(*k*), which have just passed by the leading edge 33 of the wafer, are thus still full of slurry 20. Conversely, well 102(*h*) has an empty space 109(*h*) bounded by the lower level 108 of the slurry 20 because the low pressure region above the planarizing surface 106 has drawn some of the slurry out of well 102(*h*). As the pad 100 moves under the wafer 30, slurry is continuously drawn out of the wells until they pass beyond the trailing edge 35 of the wafer 30. In well 102(*a*), therefore, the lower level 108 of the slurry rests just below its hole 104(*a*).

FIG. 9B shows the pad 100 at a subsequent point in time after which well 102(*l*) has moved from the leading edge 33 to the trailing edge 35. As with well 102(*a*), the slurry 20 in well 102(*l*) has been drawn out of the well into the space between the second dielectric layer 42 and the planarizing surface 106.

The size of the holes 104 are small enough to create a sufficiently large pressure differential at the planarizing surface 106 in order to continuously draw the slurry 20 out of the wells 102. In one embodiment, circular holes have a diameter between 1 and 3 mm, but other holes sizes are within the scope of the invention according to the velocity difference between the pad 100 and the wafer 30. The depth and width of the wells 102 are large enough to hold a sufficient volume of slurry 20 so that the wells are not completely drained by the time they pass the trailing edge 35 of the wafer 30.

A high-slurry-transport pad, such as the pad 100 shown in FIGS. 9A and 9B, is especially useful in the method of the invention for planarizing SOF wafers with a slurry that is selective to the second dielectric layer 42. The pad 100 enhances the ability to provide a substantially continuous film of slurry between the wafer 30 and the pad 100. Thus, when used with the method of the invention, a high-slurry transport pad further reduces removal of material from the initially exposed regions of the first dielectric layer 40.

The present invention significantly enhances the uniformity of the planarized surface because it relies on the selectivity of the slurry, and enhances such selectivity by maximizing chemical planarization while minimizing mechanical planarization. The selectivity of the slurry solution is enhanced by the following aspects of the method of the invention: (1) moving the wafer and the pad with respect to each other at a low relative velocity that provides a substantially continuous film of slurry between the pad and wafer and reduces the temperature at the pad-wafer interface; and (2) using a relatively low platen temperature to reduce the temperature at the pad-wafer interface. To further enhance the selectivity of the slurry, a high-slurry-transport pad is preferably used in the method of the invention. Accordingly, the present invention substantially prevents removal of material from the initially exposed regions of the first dielectric layer, while still allowing removal of material from the second dielectric layer.

It will be appreciated that, although specific embodiments of the invention have been described herein for purposes of illustration, various modifications may be made without departing from the spirit and scope of the invention. Accordingly, the invention is not limited except as by the appended claims.

We claim:

1. A chemical-mechanical planarization method to selectively remove an upper layer from a stop-on-feature layer of a stop-on-feature semiconductor wafer, comprising:

positioning the wafer against a layer of liquid solution on a planarizing surface of a polishing pad;

moving at least one of the pad or the wafer with respect to the other at a relatively low velocity; and controlling the temperature of a platen upon which the pad is positioned by heating the platen.

2. The method of claim 1 wherein controlling the temperature of the platen comprises heating the platen to a temperature between 85 and 105° F.

3. The method of claim 1 wherein:

moving at least one of the pad or the wafer comprises rotating the pad at approximately 25–35 rpm and rotating the wafer at approximately 10–50 rpm; and controlling the temperature of the platen comprises heating the platen to a temperature between 85 and 105° F.

4. The method of claim 1 wherein controlling the temperature of the platen comprises heating the platen to a temperature between 89–91° F.

5. The method of claim 1 wherein:

moving at least one of the pad or the wafer comprises rotating the pad at approximately 25–35 rpm and rotating the wafer at approximately 10–50 rpm; and controlling the temperature of the platen comprises heating the platen to a temperature between 89–91° F.

6. A chemical-mechanical planarization method to selectively remove an upper layer from a stop-on-feature layer of a stop-on-feature semiconductor wafer, comprising:

positioning the wafer against a layer of liquid solution on a planarizing surface of a polishing pad;

moving at least one of the pad or the wafer with respect to the other at a relatively low velocity; and controlling the temperature of a platen upon which the pad is positioned to maintain a temperature of the solution on the pad in a first temperature range and to maintain a temperature of the polishing pad in a second temperature range.

7. The method of claim 6 wherein controlling the temperature of the platen comprises heating the platen to a temperature between 85 and 105° F.

8. The method of claim 6 wherein:

moving at least one of the pad or the wafer comprises rotating the pad at approximately 25–35 rpm and rotating the wafer at approximately 10–50 rpm; and controlling the temperature of the platen comprises heating the platen to a temperature between 85 and 105° F.

9. The method of claim 6 wherein controlling the temperature of the platen comprises heating the platen to a temperature between 89–91° F.

10. The method of claim 6 wherein:

moving at least one of the pad or the wafer comprises rotating the pad at approximately 25–35 rpm and rotating the wafer at approximately 10–50 rpm; and controlling the temperature of the platen comprises heating the platen to a temperature between 89–91° F.

11. A chemical-mechanical planarization method to selectively remove an upper layer from a stop-on-feature layer of a stop-on-feature semiconductor wafer, comprising:

positioning the wafer against a layer of liquid solution on a planarizing surface of a polishing pad;

moving at least one of the pad or the wafer with respect to the other at a relatively low velocity by rotating the pad at 25–35 rpm and rotating the wafer at 10–50 rpm; and regulating the temperature of a platen upon which the pad is positioned to maintain the temperature of the platen between 85 and 105° F.

12. A chemical-mechanical planarization method to selectively remove an upper layer from a stop-on-feature layer of a stop-on-feature semiconductor wafer, comprising:

positioning the wafer on a planarizing surface of a polishing pad;

moving at least one of the pad or the wafer with respect to the other at a relatively low velocity by rotating the pad at 25–35 rpm and rotating the wafer at 10–50 rpm; and regulating the temperature of a platen upon which the pad is positioned to maintain the temperature of the platen between 89 and 91° F.

* * * * *